United States Patent
Kung et al.

(10) Patent No.: US 9,786,588 B2
(45) Date of Patent: Oct. 10, 2017

(54) CIRCUIT SUBSTRATE AND PACKAGE STRUCTURE

(71) Applicant: VIA Alliance Semiconductor Co., Ltd., Shanghai (CN)

(72) Inventors: Chen-Yueh Kung, New Taipei (TW); Hsin-I Chuang, New Taipei (TW); Ting-You Wei, New Taipei (TW)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 23 days.

(21) Appl. No.: 14/859,640

(22) Filed: Sep. 21, 2015

(65) Prior Publication Data
US 2016/0172289 A1    Jun. 16, 2016

(30) Foreign Application Priority Data

Dec. 10, 2014   (TW) .............................. 103142958 A (51) Int. Cl.
*H01L 23/498* (2006.01)
*H01L 23/00* (2006.01)

(52) U.S. Cl.
CPC .. *H01L 23/49827* (2013.01); *H01L 23/49838* (2013.01); *H01L 24/09* (2013.01); *H01L 24/17* (2013.01); *H01L 2224/0401* (2013.01); *H01L 2224/14* (2013.01); *H01L 2224/16157* (2013.01); *H01L 2224/16225* (2013.01); *H01L 2224/17* (2013.01); *H01L 2924/1511* (2013.01); *H01L 2924/15311* (2013.01)

(58) Field of Classification Search
CPC ......... H01L 23/49827; H01L 23/49838; H01L 24/09; H01L 24/17; H01L 2224/0401; H01L 2224/16157; H01L 2924/1511; H01L 2924/15311
See application file for complete search history.

(56) References Cited

U.S. PATENT DOCUMENTS

2013/0168857 A1* 7/2013 Gregorich ......... H01L 23/49827
                                                              257/738
2015/0270232 A1* 9/2015 Chen ...................... H01L 24/02
                                                              257/691

FOREIGN PATENT DOCUMENTS

CN        103021969        4/2013
TW        M477045          4/2014

\* cited by examiner

*Primary Examiner* — William F Kraig
*Assistant Examiner* — Khatib Rahman
(74) *Attorney, Agent, or Firm* — McClure, Qualey & Rodack, LLP (57) ABSTRACT

The invention provides a circuit substrate and a package structure. The circuit substrate includes a molding compound having a chip-side surface and a solder ball-side surface opposite from the chip side surface. A first conductive bulk is formed embedded in the molding compound. The first conductive bulk has a first number of first chip-side bond pad surfaces and a second number of first solder ball-side surfaces exposed from the chip side surface and the ball-side surface, respectively. The width of the first conductive bulk is greater than the first width of the first chip-side bond pad surfaces and the second width of the first solder ball-side surfaces.

30 Claims, 12 Drawing Sheets

CIRCUIT SUBSTRATE AND PACKAGE STRUCTURE

CROSS REFERENCE TO RELATED APPLICATIONS

This Application claims priority of Taiwan Patent Application No. 103142958, filed on Dec. 10, 2014, the entirety of which is incorporated by reference herein.

BACKGROUND OF THE INVENTION

Field of the Invention

The present invention relates to a circuit substrate and a package structure, and in particular to a circuit substrate and a package structure with a high routing density.

Description of the Related Art

In semiconductor package assembly technology, chip carriers are currently used to connect semiconductor integrated circuit (IC) chips to electronic devices in the lower layered-level, such as circuit boards like motherboards or module boards. The circuit boards are usually used as high pin-count chip carriers. The circuit boards are formed by alternatively laminating a plurality of patterned conductive layers and a plurality of dielectric layers. Any two of the patterned conductive layers can be electrically connected to each other through conductive vias.

However, the routing density and the bump density of the circuit boards must be increased to meet the requirements of the integrated multi-chip packages and the multiple input/output (I/O) terminals chips.

Thus, a novel circuit substrate and a novel package structure are desirable.

BRIEF SUMMARY OF THE INVENTION

Exemplary embodiments provide a circuit substrate and a package structure. An exemplary embodiment of a circuit substrate for a chip bonding thereon includes a molding compound having a chip-side surface and a solder ball-side surface opposite from the chip-side surface. A first conductive bulk is formed embedded in the molding compound. The first conductive bulk has a first number of first chip-side bond pad surfaces exposed from the chip-side surface and a second number of first ball-side bond pad surfaces exposed from the solder ball-side bond pad surface. The width of the first conductive bulk is greater than the first width of the first chip-side bond pad surfaces and the second width of the first ball-side bond pad surfaces in a cross-sectional view.

An exemplary embodiment of a package structure includes a molding compound having a chip-side surface and a solder ball-side bond pad surface opposite from the chip-side surface. A first conductive bulk is formed embedded in the molding compound. The first conductive bulk having a first number of first chip-side bond pad surfaces exposed from the chip-side surface and a second number of first ball-side bond pad surfaces exposed from the solder ball-side bond pad surface. The width of the first conductive bulk is greater than the first width of the first chip-side bond pad surfaces and the second width of the first ball-side bond pad surfaces in a cross-sectional view. The circuit substrate comprises a chip bonding the circuit substrate. The chip comprises a plurality of pads connecting the first chip-side bond pad surfaces through a plurality of respective pads.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a circuit substrate for a chip bonding thereon. The circuit substrate uses a conductive bulk, which is embedded within a molding compound, serving as an interconnection of the circuit substrate. The molding compound also serves as a solder mask layer of the circuit substrate. The conductive bulk may connect one or more chip-side bond pads, or connect one or more solder ball-side bond pads. In some embodiments, the conductive bulk is composed of several segments connecting to each other. The segments may have different numbers of chip-side bond pads and solder ball-side bond pads. In some other embodiments, the conductive bulk can be fully encapsulated by the molding compound to be electrically isolated from other conductive bulks, the chip-side bond pads and the solder ball-side bond pads. The conductive bulk electrically isolated from other elements may provide the functions of the heat dissipation and the circuit substrate strength enhancement.

FIGS. 1A, 2A, 3A, 4A, 5A and 6A are three-dimensional (3D) views of a circuit substrate in accordance with various embodiments of the disclosure. FIGS. 1B, 2B-2C, 3B-3C, 4B, 5B and 6B are cross-sectional views along lines A-A' of FIGS. 1A, 2A, 3A, 4A, 5A and 6A, respectively. FIGS. 1B, 2B-2C, 3B-3C, 4B, 5B and 6B illustrate various designs of the conductive bulks of the circuit substrate. FIGS. 1B, 2B-2C, 3B-3C, 4B, 5B and 6B also illustrate a chip 300 bonding on the circuit substrate to describe the connection between a solder ball-side surface of the circuit substrate and a conductive bump for conveniently illustrating the arrangement of the circuit substrate. Additionally, the circuit substrate and the chip bonded thereon may collectively form a semiconductor package structure.

Figure 1A:
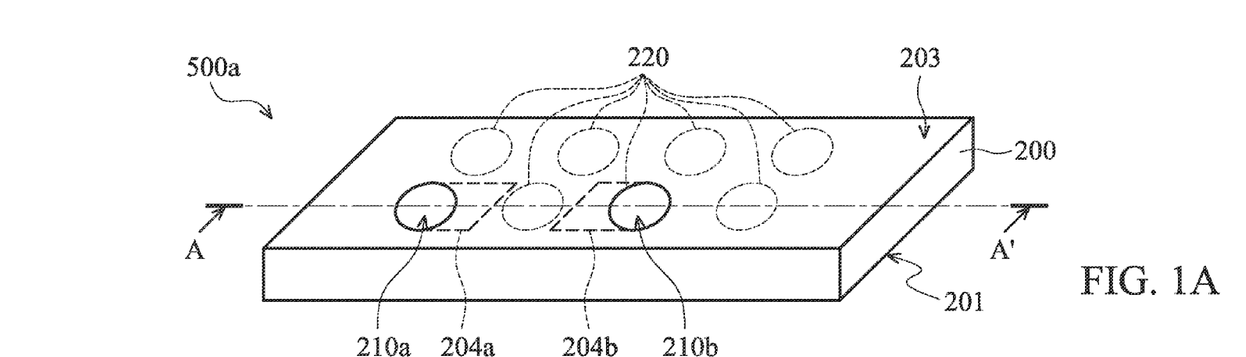
FIGS. 1A, 2A, 3A, 4A, 5A and 6A are three-dimensional views of a circuit substrate in accordance with various embodiments of the disclosure.
Figure 1B:
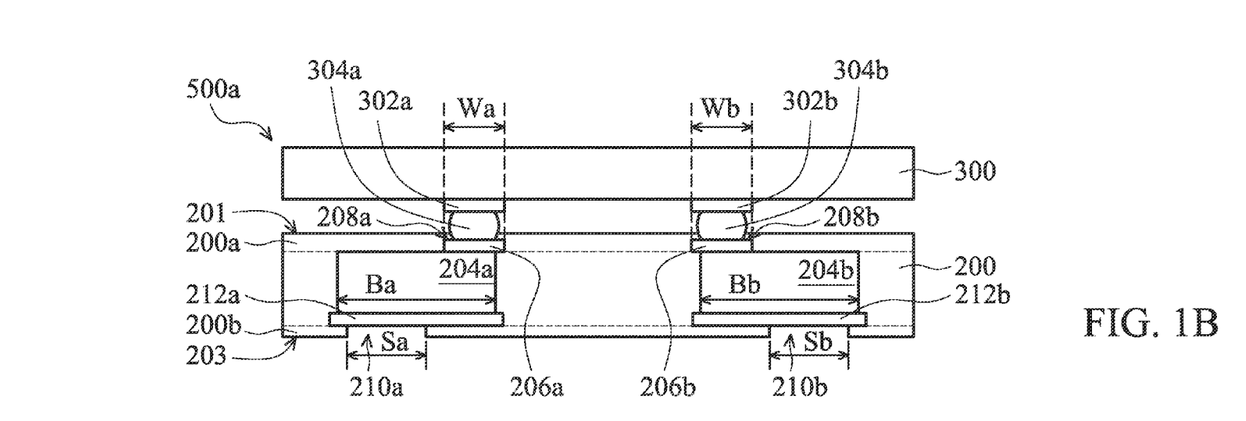
FIGS. 1B, 2B-2C, 3B-3C, 4B, 5B and 6B are cross-sectional views along lines A-A' of FIGS. 1A, 2A, 3A, 4A, 5A and 6A, respectively.

As shown in FIGS. 1A and 1B, a circuit substrate 500a includes a molding compound 200 and conductive bulks 204a and 204b. The molding compound 200 has a chip-side surface 201 and a solder ball-side surface 203 opposite from the chip-side surface 201. In some embodiments, the molding compound 200 may comprise epoxy-based polymers. The main composition of the epoxy-based polymers comprises thermosetting polymers. Additionally, the molding compound 200 may include portions 200a and 200b opposite from each other. The portions 200a and 200b may serve as solder mask layer of the circuit substrate 500a. The portions 200a and 200b have openings, so that corresponding chip-side bond pad surfaces and solder ball-side surfaces are exposed from the openings. In some embodiments, the portions 200a and 200b and the center portion of the molding compound 200 may be made of the same materials. In some other embodiments, the portions 200a and 200b may include solder mask materials.

As shown in FIGS. 1A and 1B, the conductive bulks 204a and 204b are embedded in the molding compound 200. The conductive bulk 204a has a chip-side bond pad 206a, which is close to the chip-side surface 201, and a solder ball-side bond pad 212a, which is close to the solder ball-side surface 203. Similarly, the conductive bulk 204b has a chip-side bond pad 206b, which is close to the chip-side surface 201, and a solder ball-side bond pad 212b, which is close to the solder ball-side surface 203. In some embodiments, materials of the conductive bulks 204a and 204b, the chip-side bond pads 206a and 206b, the solder ball-side bond pads 212a and 212b may comprise metals such as copper.

As shown in FIGS. 1A and 1B, the conductive bulk 204a has a single chip-side bond pad surface 208a and single solder ball-side bond pad surface 210a. The conductive bulk 204b also has a single chip-side bond pad surface 208b and single solder ball-side bond pad surface 210b. The chip-side bond pad surfaces 208a and 208b are respectively exposed from the chip-side surface 201 of the portion 200a of the molding compound 200. The solder ball-side bond pad surfaces 210a and 210b are respectively exposed from the solder ball-side surface 203 of the portion 200b of the molding compound 200. The chip-side bond pad surfaces 208a and 208b respectively bond to bond pads 302a and 302b through conductive bumps 304a and 304b, for example, under bump metallization (UBM) pads. From the above description, the relation between the number of chip-side bond pad surfaces and that of solder ball-side bond pad surfaces is one-to-one correspondence as shown in FIG. 1B. Therefore, the conductive bulks 204a and 204b may serve as interconnections, which transmit power signals, digital signals and ground (GND) signals, to couple to the corresponding bond pads 302a and 302b of the chip 300. Also, the elements 220 as shown in FIG. 1A illustrate positions for disposing the solder ball-side bond pads.

In the cross-sectional view of the circuit substrate 500a as shown in FIG. 1B, the widths Ba, Bb of the conductive bulks 204a and 204b embedded in the molding compound 200 are designed to be greater than the widths Wa, Wb of the chip-side bond pad surfaces 208a and 208b and the widths Sa, Sb of the solder ball-side bond pad surfaces 210a and 210b. Therefore, in this embodiment, the chip-side bond pad surfaces 208a and 208b of the conductive bulks 204a and 204b may not overlap the solder ball-side bond pad surfaces 210a and 210b, respectively. In other embodiments, the chip-side bond pad surfaces 208a and 208b of the conductive bulks 204a and 204b may partially overlap or fully overlap the solder ball-side bond pad surfaces 210a and 210b, respectively. Additionally, in a bottom view of the of the circuit substrate 500a as shown in FIG. 1A, the solder ball-side bond pad surface 210a of the conductive bulk 204a and the solder ball-side bond pad surface 210b of the conductive bulk 204b are exposed form the solder ball-side surface 203.

Figure 2A:
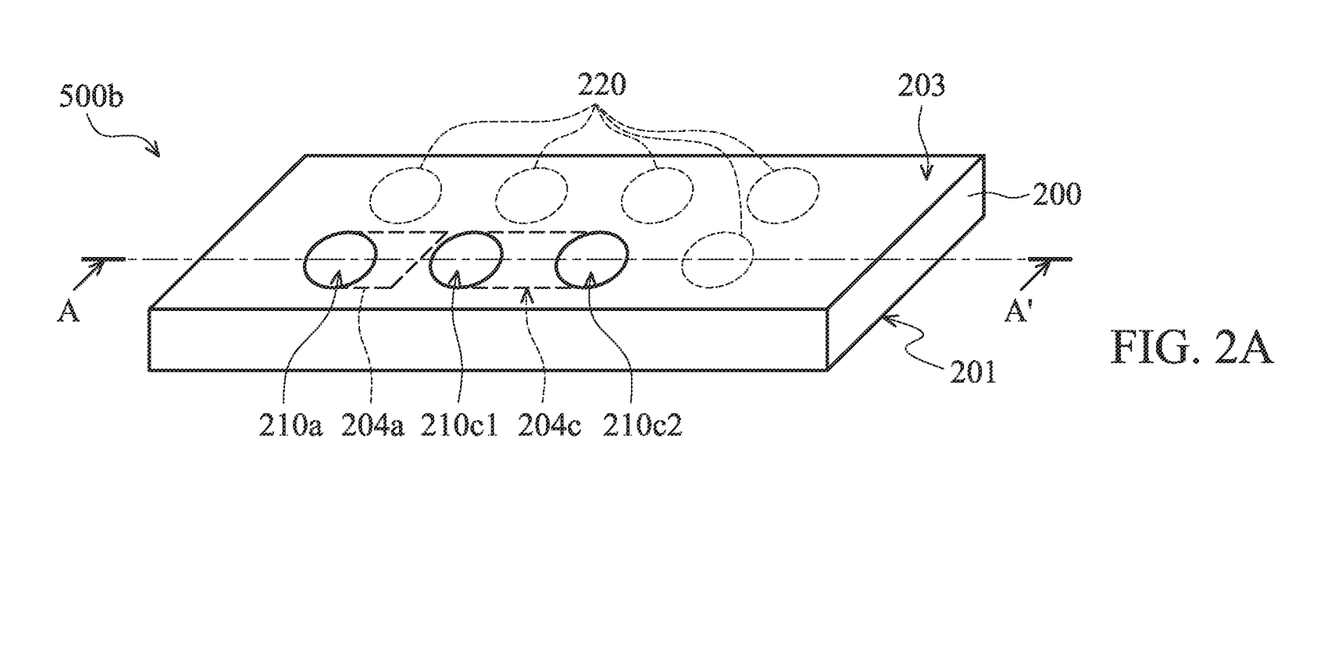
Figure 2B:
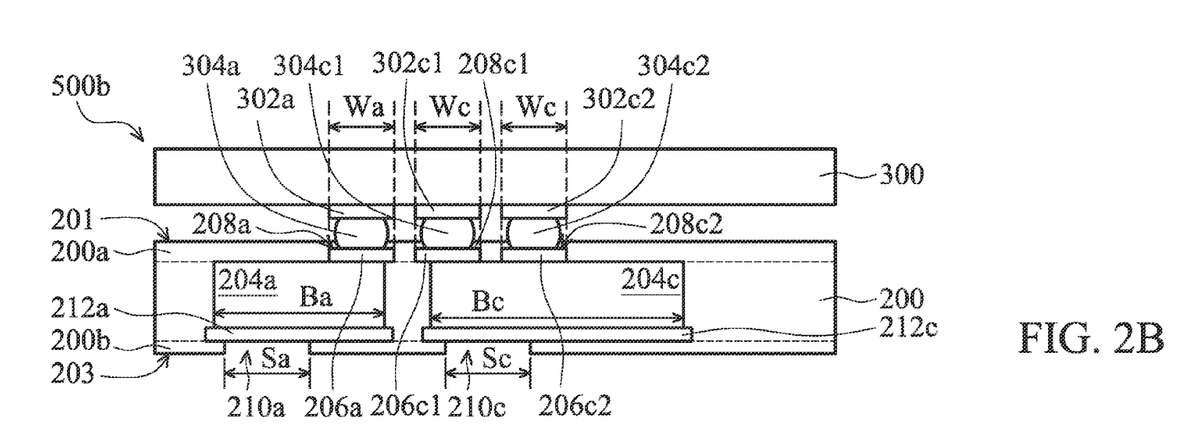

FIG. 2B is a cross-sectional view of a circuit substrate 500b in accordance with one embodiment of the disclosure. Elements of the embodiments hereinafter, that are the same or similar as those previously described with reference to FIGS. 1A-1B, are not repeated for brevity.

One of the differences between the circuit substrate 500b as shown in FIG. 2B and the circuit substrate 500a as shown in FIG. 2A is that the relation between the number of chip-side bond pad surfaces and that of solder ball-side bond pad surfaces of a conductive bulk 204c of the circuit substrate 500b is a many-to-one correspondence but not a one-to-one correspondence as shown in FIG. 2B. As shown in FIG. 2B, the conductive bulk 204c of the circuit substrate 500b has two chip-side bond pads 206c1 and 206c2, which are close to the chip-side surface 201, and a single solder ball-side bond pad 212c, which is close to the solder ball-side surface 203. The conductive bulk 204c has two chip-side bond pad surfaces 208c1 and 208c2 and a single solder ball-side bond pad surface 210c, which corresponds to the chip-side bond pad surfaces 208c1 and 208c2.

As shown in FIG. 2B, bond pads 302c1 and 302c2 of the chip 300 bond to different chip-side bond pad surfaces 208c1 and 208c2 of the single conductive bulk 204c of the circuit substrate 500b through conductive bumps 304c1 and 304c2, respectively. From the above description, the relation between the number of chip-side bond pad surfaces and that of the solder ball-side bond pad surfaces of a conductive bulk 204c of the circuit substrate 500b is a many-to-one correspondence (e.g. a two-to-one correspondence) but not a one-to-one correspondence. Therefore, the bond pads 302c1 and 302c2 of the chip 300, which are used to transmit the same type of signals (power signals, digital signals or ground (GND) signals), may bond to the corresponding conductive bulk 204c through the chip-side bond pad surfaces 208c1 and 208c2. The signals may transmit to a single solder ball (not shown) through the single solder ball-side bond pad surface 210c.

Figure 2C:
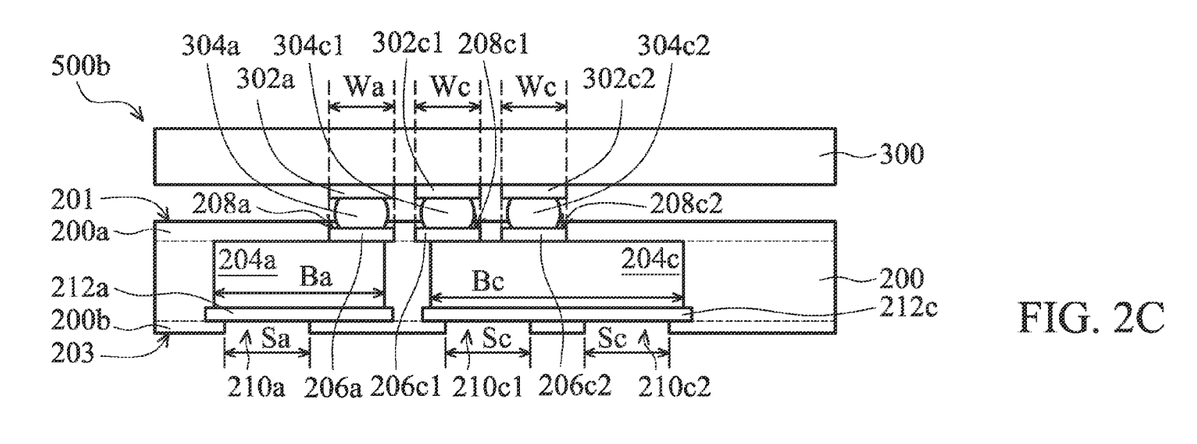

In some other embodiments, the relation between the number of chip-side bond pad surfaces and that of the solder ball-side bond pad surfaces of a conductive bulk of the circuit substrate is a many-to-many correspondence. As shown in FIGS. 2A and 2C, the conductive bulk 204c of the circuit substrate 500b has two chip-side bond pads 206c1 and 206c2, which are close to the chip-side surface 201, and a single solder ball-side bond pad 212c, which is close to the solder ball-side surface 203. It should be noted that the conductive bulk 204c has two chip-side bond pad surfaces 208c1 and 208c2 and two corresponding solder ball-side bond pad surfaces 210c1 and 210c2.

As shown in FIGS. 2A and 2C, bond pads 302c1 and 302c2 of the chip 300 bond to different chip-side bond pad surfaces 208c1 and 208c2 of the single conductive bulk 204c of the circuit substrate 500b through conductive bumps 304c1 and 304c2, respectively. From the above description, the relation between the number of chip-side bond pad surfaces and that of solder ball-side bond pad surfaces of a conductive bulk 204c of the circuit substrate 500b is a many-to-many correspondence (e.g. a two-to-two correspondence). Therefore, the bond pads 302c1 and 302c2 of the chip 300, which are used to transmit the same type of signals (power signals, digital signals or ground (GND) signals), may bond to the corresponding conductive bulk 204c through the chip-side bond pad surfaces 208c1 and 208c2. The signals may transmit to two solder balls (not shown) through the two solder ball-side bond pad surfaces 210c1 and 210c2.

In the cross-sectional view of the circuit substrate 500b as shown in FIGS. 2B and 2C, the width Bc of the conductive bulk 204c embedded in the molding compound 200 are designed to be greater than the width Wc of the chip-side bond pad surfaces 208c1 and 208c2 and the widths Sc of the solder ball-side bond pad surfaces 210c1 and 210c2. Therefore, in this embodiment, the chip-side bond pad surfaces 208a, 208c1 and 208c2 of the conductive bulks 204a and 204b may not overlap the solder ball-side bond pad surfaces 210a, 210c1 and 210c2, respectively. In other embodiments, the chip-side bond pad surfaces 208a, 208c1 and 208c2 of the conductive bulks 204a and 204b may partially overlap or fully overlap the solder ball-side bond pad surfaces 210a, 210c1 and 210c2, respectively. Additionally, in a bottom view of the of the circuit substrate 500b, which has one or more solder ball-side bond pad surfaces, as shown in FIG. 2A, the solder ball-side bond pad surface 210a of the conductive bulk 204a and the solder ball-side bond pad surfaces 210c1 and 210c2, of the conductive bulk 204c are exposed form the solder ball-side surface 203. Also, the first area of the conductive bulk 204a is different from the second area of the conductive bulk 204c in the bottom view as shown in FIG. 2A.

Figure 3A:
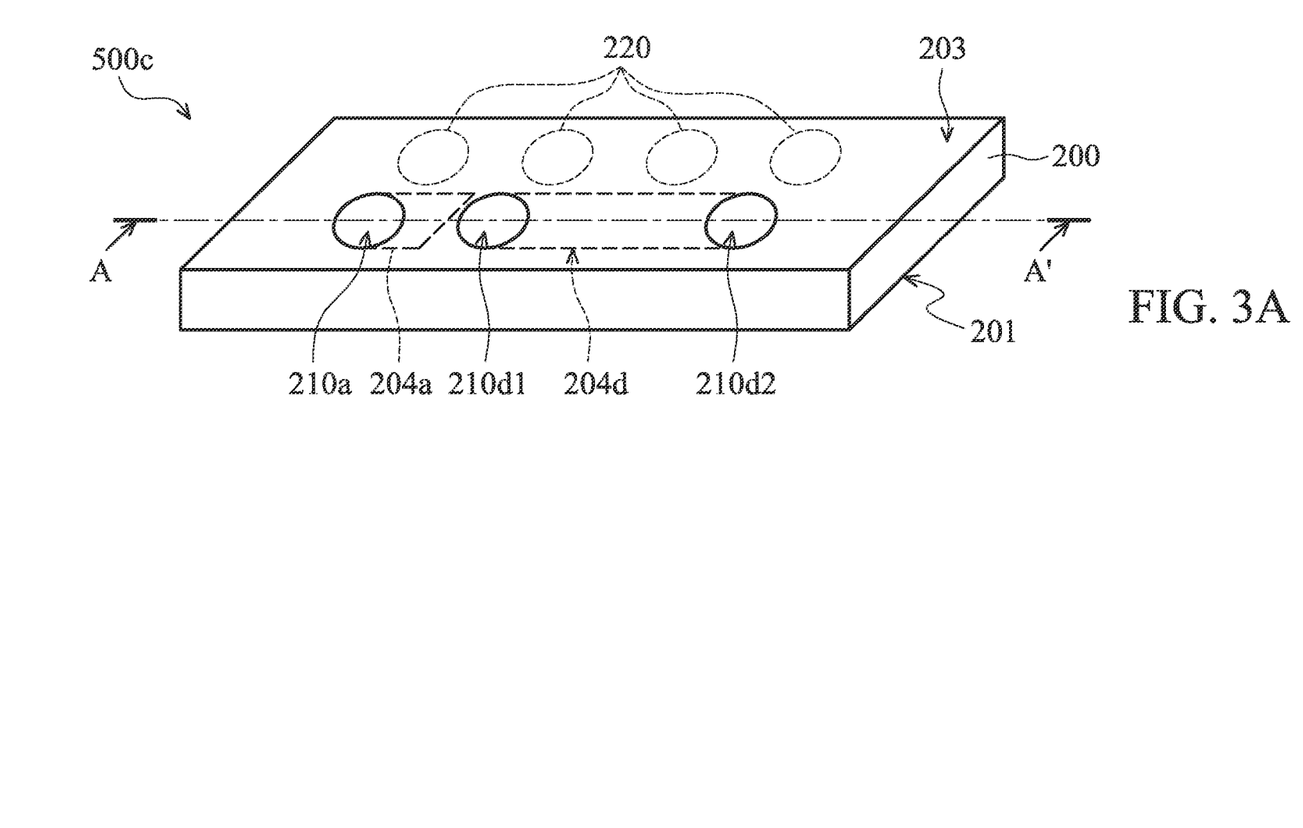
Figure 3B:
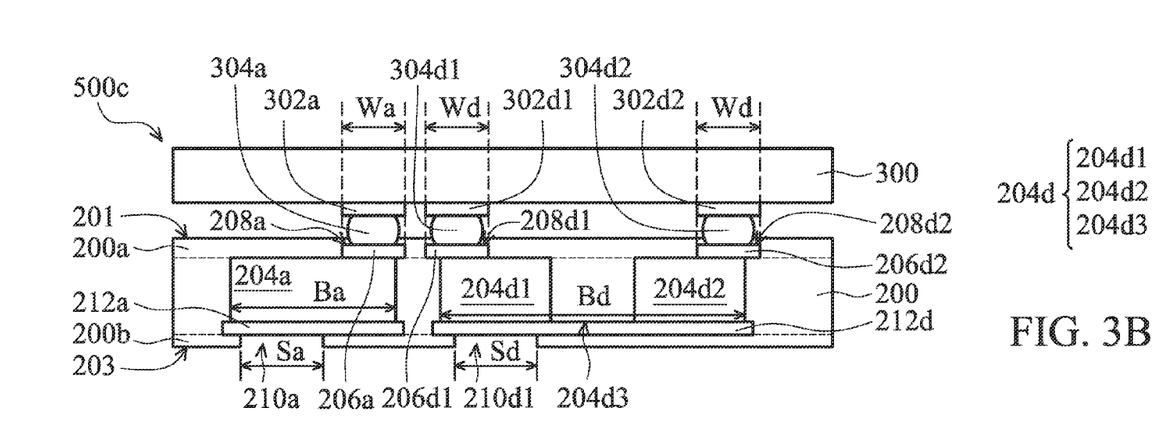

FIG. 3B is a cross-sectional view of a circuit substrate 500c in accordance with one embodiment of the disclosure. Elements of the embodiments hereinafter, that are the same or similar as those previously described with reference to FIGS. 1A-1B and 2A-2C, are not repeated for brevity.

One of the differences between the circuit substrate 500c as shown in FIG. 3B and the circuit substrate 500a as shown in FIGS. 1A-1B is that a conductive bulk 204d of the circuit substrate 500c includes segments 204d1, 204d2 and a connection portion 204d3. The segment 204d1 connects the segment 204d2 through the connection portion 204d3. As shown in FIG. 3B, a surface of the connection portion 204d3 connects sidewalls of the segments 204d1, 204d2.

One of the differences between the circuit substrate 500c as shown in FIG. 3B and the circuit substrate 500a as shown in FIG. 1B is that the relation between the number of chip-side bond pad surfaces and that of solder ball-side bond pad surfaces of a conductive bulk 204d of the circuit substrate 500c is a many-to-one correspondence. As shown in FIG. 3B, the segment 204d1 of the conductive bulk 204d has one chip-side bond pad 206d1, and the segment 204d2 of the conductive bulk 204d has one chip-side bond pad 206d2 and a single solder ball-side bond pad 212d. The chip-side bond pads 206d1 and 206d2 are close to the chip-side surface 201, and the single solder ball-side bond pad 212d is close to the solder ball-side surface 203. The conductive bulk 204d has two chip-side bond pad surfaces 208d1 and 208d2 and a single solder ball-side bond pad surface 210d1.

As shown in FIG. 3B, bond pads 302d1 and 302d2 of the chip 300 bond to different chip-side bond pad surfaces 208d1 and 208d2 of the segments 204d1, 204d2 of the conductive bulk 204d of the circuit substrate 500c through conductive bumps 304d1 and 304d2, respectively. From the above description, the relation between the number of chip-side bond pad surfaces and that of solder ball-side bond pad surfaces of a conductive bulk 204d of the circuit substrate 500c is a many-to-one correspondence (e.g. a two-to-one correspondence). Therefore, the bond pads 302d1 and 302d2 of the chip 300, which are used to transmit the same type of signals (power signals, digital signals or ground (GND) signals), may bond to the corresponding conductive bulk 204d through the chip-side bond pad surfaces 208d1 and 208d2. The signals may transmit to a single solder ball (not shown) through the single solder ball-side bond pad surface 210d1.

Figure 3C:
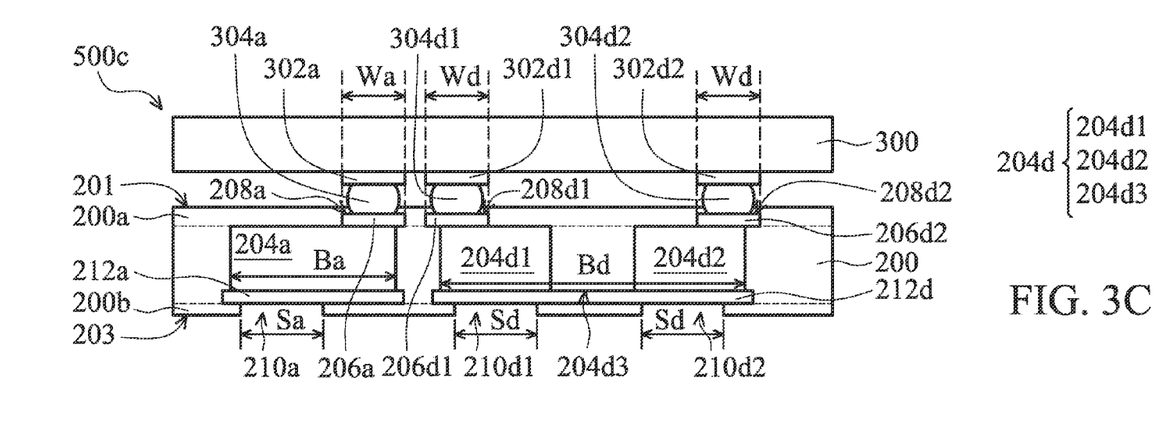

In some other embodiments as shown in FIG. 3C, the segment 204d1 has a single chip-side bond pad 206d1 and a single corresponding solder ball-side bond pad 212d. The segment 204d2 has a single chip-side bond pad 206d2 and the single corresponding solder ball-side bond pad 212d. Further, the solder ball-side bond pad 212d has two corresponding solder ball-side bond pad surfaces 210d1 and 210d2. Therefore, the relation between the number of chip-side bond pad surfaces and that of solder ball-side bond pad surfaces of a conductive bulk 204d of the circuit substrate 500c is a many-to-many correspondence as shown in FIG. 3C. As shown in FIGS. 3A and 3C, the segment 204d1 has a single chip-side bond pad 206d1, and the segment 204d2 has a single chip-side bond pad 206d2. Also, the conductive bulk 204d has a single solder ball-side bond pad 212d, which is close to the solder ball-side surface 203. It should be noted that the conductive bulk 204d has the two chip-side bond pad surfaces 208d1 and 208d2 and the two corresponding solder ball-side bond pad surfaces 210d1 and 210d2. Both the solder ball-side bond pad surfaces 210d1 and 210d2 correspond to the solder ball-side bond pad 212d.

In the cross-sectional view of the circuit substrate 500c as shown in FIGS. 3B and 3C, the width Bd of the conductive bulk 204d within the molding compound 200 is designed to be greater than the width Wd of the chip-side bond pad surfaces 208d1 and 208d2 and the width Sd of the solder ball-side bond pad surfaces 210d1 and 210d2. Additionally, in a bottom view of the of the circuit substrate 500a as shown in FIG. 3A, the solder ball-side bond pad surface 210a of the conductive bulk 204a and the solder ball-side bond pad surfaces 210d1 and 210d2 of the conductive bulk 204d are exposed form the solder ball-side surface 203. Also, the first area of the conductive bulk 204a is different from the second area of the conductive bulk 204d in the bottom view as shown in FIG. 3A.

In some other embodiments, the chip-side bond pad surfaces and the older-ball side bond pad surfaces of the conductive bulk may be positioned on different respective segments. Therefore, the chip-side bond pad surface of the conductive bulk may correspond to the solder ball-side bond pad surface separated therefrom by any value of the distance. Therefore, the flexibility of the routing of the interconnection is increased. The embodiments are described as follows.

Figure 4A:
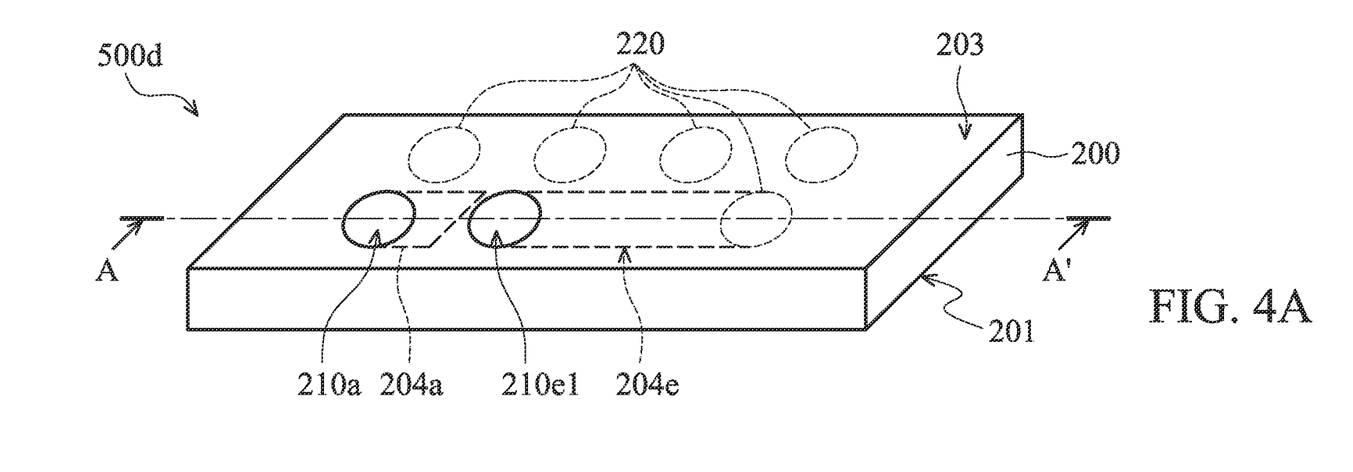
Figure 4B:
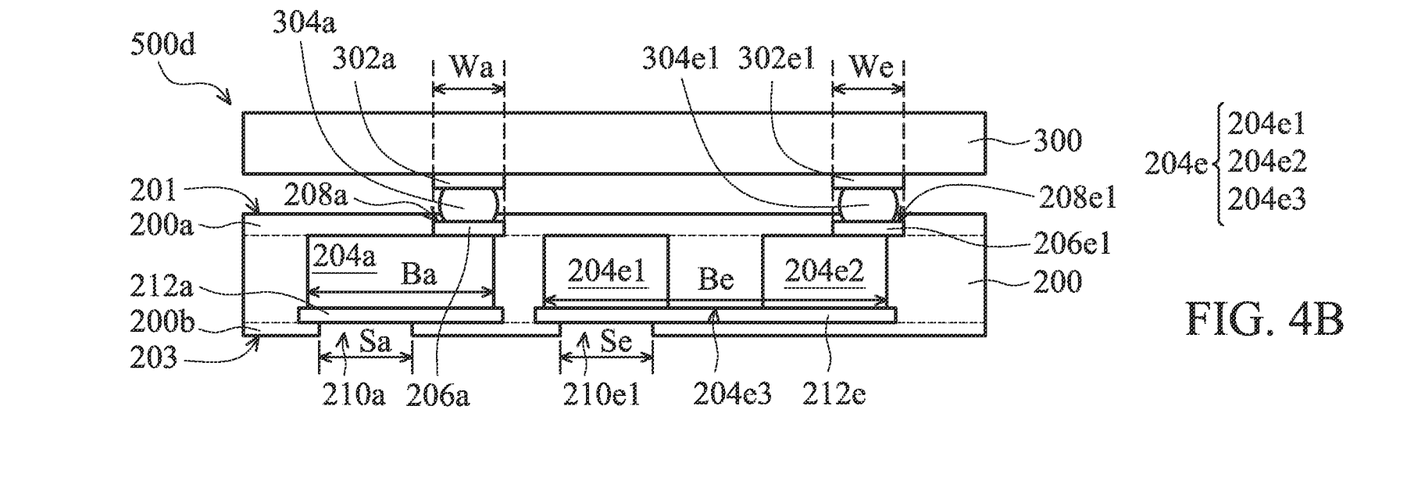

FIGS. 4A and 4B are three-dimensional (3D) and cross-sectional views of a circuit substrate 500d in accordance with one embodiment of the disclosure. Elements of the embodiments hereinafter, that are the same or similar as those previously described with reference to FIGS. 1A-1B, 2A-2C and 3A-3C, are not repeated for brevity.

One of the differences between the circuit substrate 500d as shown in FIGS. 4A and 4B and the circuit substrate 500c as shown in FIGS. 3A-3C is that the relation between the number of chip-side bond pad surfaces and that of solder ball-side bond pad surfaces of a conductive bulk 204e of the circuit substrate 500d is one-to-one correspondence. As shown in FIGS. 4A and 4B, a single chip-side bond pad 206e1 of the conductive bulk 204e, which is close to the chip-side surface 201, is positioned on a segment 204e2. A solder ball-side bond pad 212e of the conductive bulk 204e, which is close to the solder ball-side surface 203, is positioned on a segment 204e1, the segment 204e2 and a connection portion 204e3. It should be noted that the conductive bulk 204e has a single chip-side bond pad surface 208e1 and a single solder ball-side bond pad surface 210e1, which corresponds to the chip-side bond pad surface 208e1. Therefore, a bond pad 302e1 of the chip 300, which is used to transmit the same type of signals (power signals, digital signals or ground (GND) signals), may bond to the chip-side bond pad surface 208e1 of the corresponding segment 204e2 of the conductive bulk 204e through a conductive bump 304e1. The signals may transmit to a single solder ball (not shown) through the connection portion 204e3, which is electrically connected to the segment 204e2, and the single solder ball-side bond pad surface 210e1 on the segment 204e1.

In the cross-sectional view of the circuit substrate 500d as shown in FIG. 4B, the width Be of the conductive bulk 204e within the molding compound 200 is designed to be greater than the width We of the chip-side bond pad surface 208e1 and the width Se of the solder ball-side bond pad surface 210e1. Also, the single chip-side bond pad surface 208e1 and the single solder ball-side bond pad surface 210e1 corresponding thereto are positioned on the different segments 204e1 and 204e2, respectively. Therefore, the chip-side bond pad surface 208e1 does not overlap the solder ball-side bond pad surface 210e1. Additionally, in a bottom view of the of the circuit substrate 500d as shown in FIG. 4A, the solder ball-side bond pad surface 210a of the conductive bulk 204a and the single solder ball-side bond pad surface 210e1 of the conductive bulk 204e are exposed form the solder ball-side surface 203. Also, the first area of the conductive bulk 204a is different from the second area of the conductive bulk 204e in the bottom view as shown in FIG. 4A.

In some other embodiments, the conductive bulk may be fully encapsulated by the molding compound, and electrically isolated form the other conductive bulks, the chip-side bond pads and the solder ball-side bond pads. The electrically isolated conductive bulk may serve as a strength-enhancement structure or a heat dissipation bulk for the circuit substrate. The embodiments are described as follows.

Figure 5A:
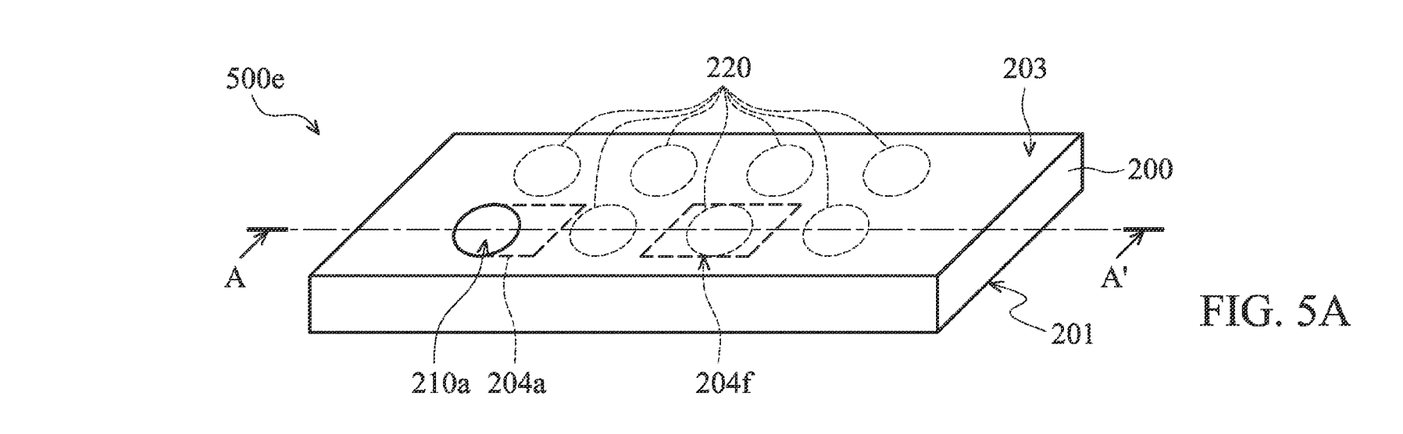
Figure 5B:
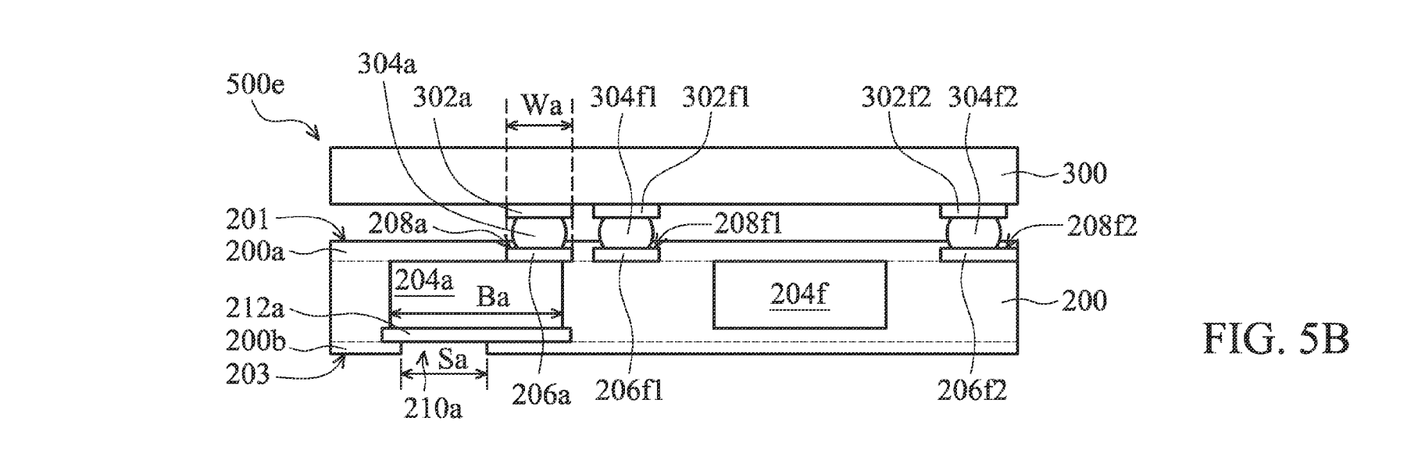

FIGS. 5A and 5B are three-dimensional (3D) and cross-sectional views of a circuit substrate 500e in accordance with one embodiment of the disclosure. Elements of the embodiments hereinafter, that are the same or similar as those previously described with reference to FIGS. 1A-1B, 2A-2C, 3A-3C and 4A-4B, are not repeated for brevity.

One of the differences between the circuit substrate 500e as shown in FIGS. 5A-5B and the circuit substrate 500a as shown in FIGS. 1A-1B is that a conductive bulk 204f of the circuit substrate 500e is fully encapsulated by the molding compound 200. The conductive bulk 204f is not only electrically isolated from the conductive bulk 204a, but also electrically isolated from the chip-side bond pads 206a 208f1, 208f2 and the solder ball-side bond pad 212a. That is to say, the conductive bulk 204f is in contact with the molding compound 200 only, because the conductive bulk 204f of the circuit substrate 500g is fully encapsulated by the molding compound 200. Therefore, in a bottom view of the of the circuit substrate 500e as shown in FIG. 5A, the solder ball-side bond pad surface 210a of the conductive bulk 204a is exposed from the molding compound 200 only. The conductive bulk 204f is fully covered by the molding compound 200.

In some other embodiments, the conductive bulk, which serves as the strength-enhancement structure or the heat dissipation bulk for the circuit substrate, may be composed of several segments. The several segments connect to each other through a connection portion. Also, the several segments and the connection portion are electrically isolated from other conductive bulks in the molding compound. The embodiments are described as follows.

Figure 6A:
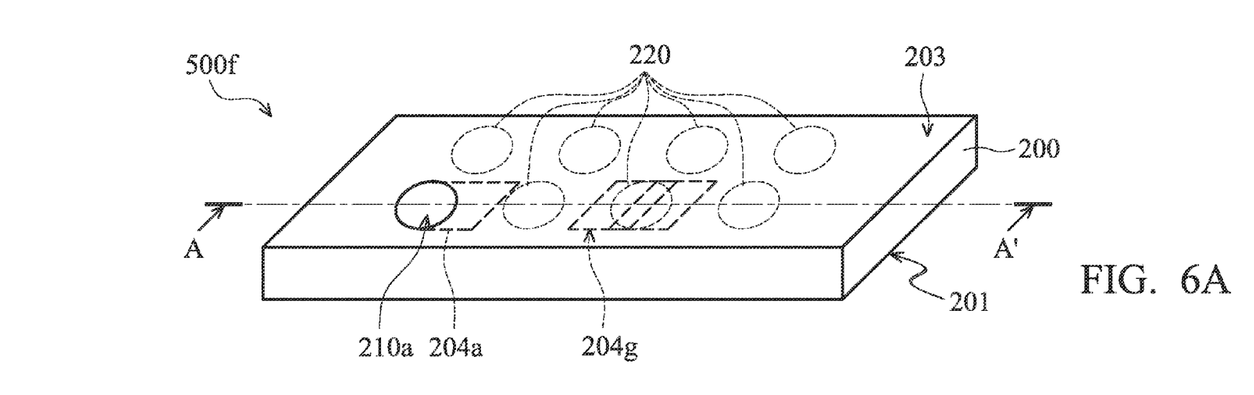
Figure 6B:
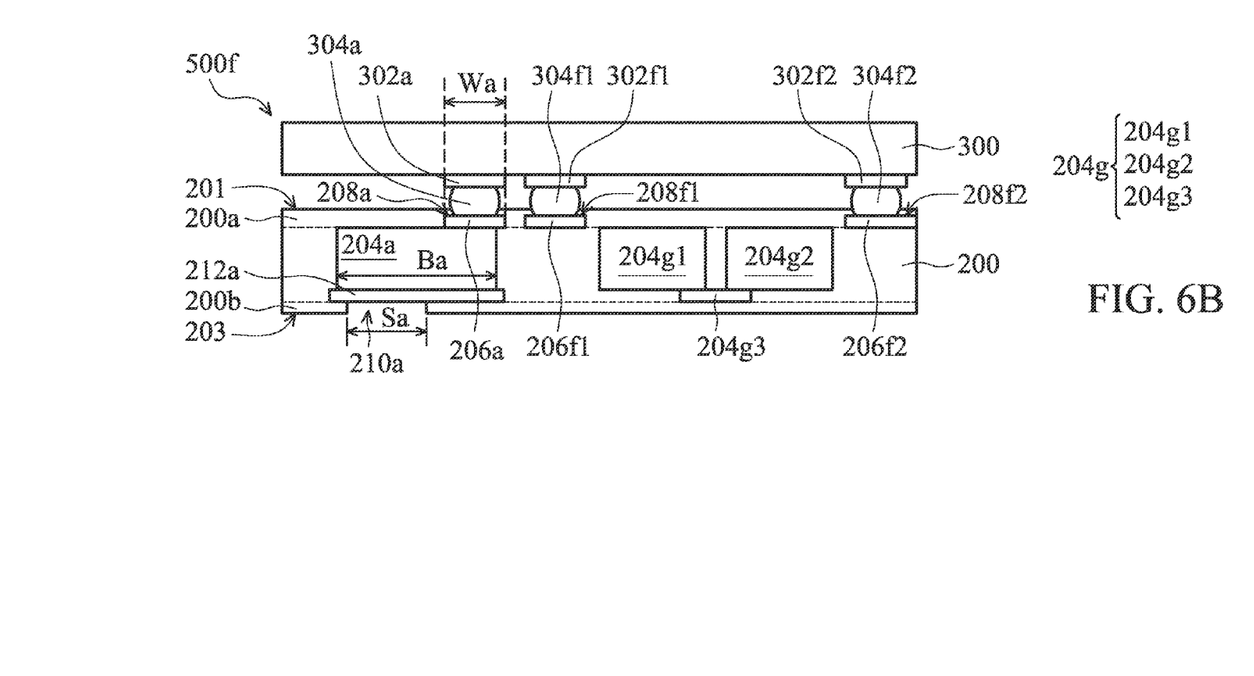

FIGS. 6A and 6B are three-dimensional (3D) and cross-sectional views of a circuit substrate 500f in accordance with one embodiment of the disclosure. Elements of the embodiments hereinafter, that are the same or similar as those previously described with reference to FIGS. 1A-1B, 2A-2C, 3A-3C, 4A-4B and 5A-5B, are not repeated for brevity.

One of the differences between the circuit substrate 500f as shown in FIGS. 6A-6B and the circuit substrate 500e as shown in FIGS. 5A-5B is that a segment 204g of the circuit substrate 500f comprises segments 204g1, 204g2 and a connection portion 204g3. The segment 204g1 connects the segment 204g2 through the connection portion 204g3. As shown in FIG. 6B, a surface of the connection portion 204g3 connects sidewalls of the segments 204g1, 204g2. Also, the segments 204g1, 204g2 and the connection portion 204g3 are electrically isolated from another conductive bulk 204a, the chip-side bond pads 206a, 208f1, 208f2 and the solder ball-side bond pad 212a in the molding compound 200, because the conductive bulk 204g of the circuit substrate 500f is fully encapsulated by the molding compound 200. In a bottom view of the of the circuit substrate 500f as shown in FIG. 6A, the solder ball-side bond pad surface 210a of the conductive bulk 204a is exposed from the molding compound 200 only. The conductive bulk 204g is fully covered by the molding compound 200.

Figure 7:
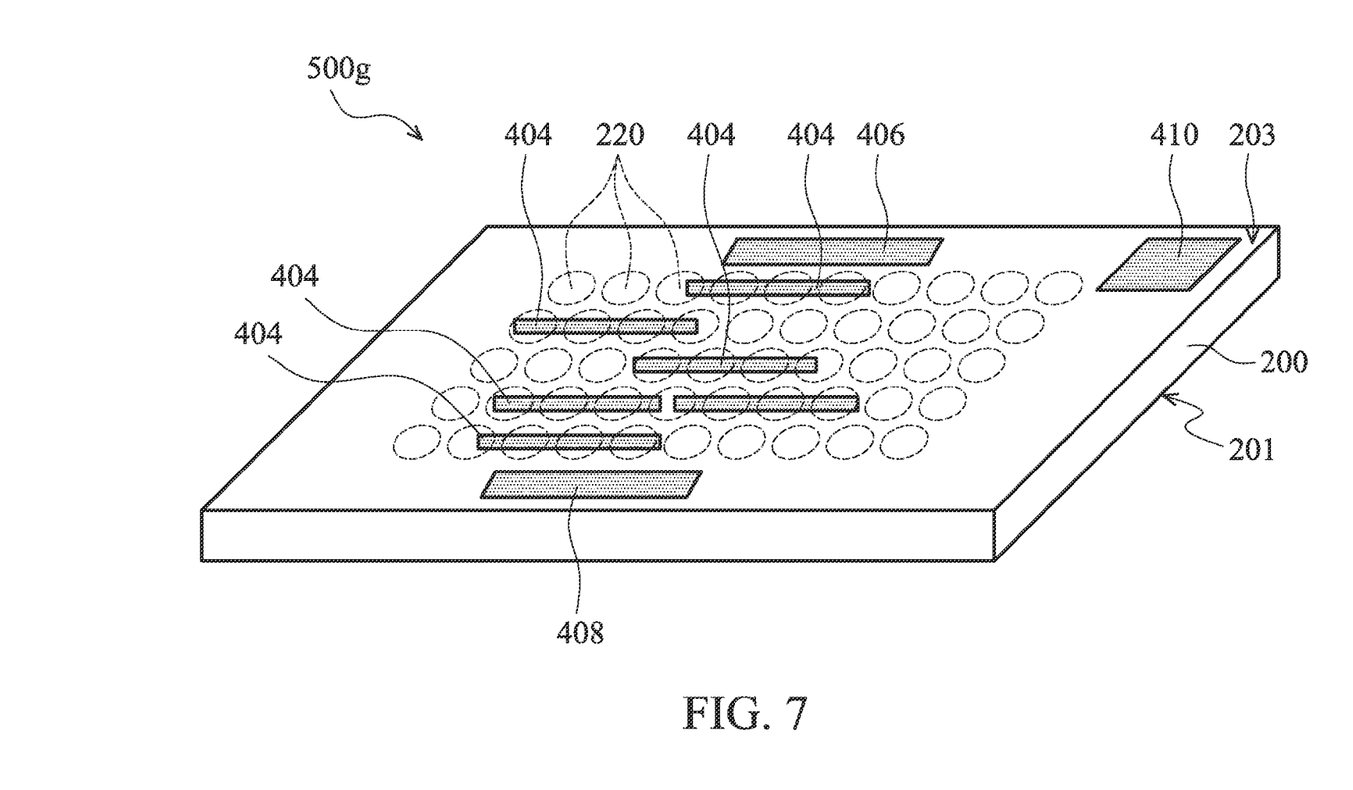
FIGS. 7-10 are three-dimensional views of a circuit substrate in accordance with other embodiments of the disclosure.

FIG. 7 is three-dimensional (3D) view of a circuit substrate 500g in accordance with one embodiment of the disclosure. For conveniently illustrating the relationship between the positions of the conductive bulk and the solder ball-side bond pad, the solder mask layer and any possible chip-side bond pads are not shown herein. Actually, the conductive bulk is positioned in the molding compound and covered by the solder mask layer. In some other embodiments, the conductive bulk may be disposed in a region corresponding to the solder ball-side bond pad to bond to the solder ball. Also, the conductive bulk may be disposed in the peripheral region of the circuit substrate to serve as the strength-enhancement structure or the heat dissipation bulk for the circuit substrate.

As shown in FIG. 7, the circuit substrate 500g includes conductive bulks 404 corresponding to positions 220 of the solder ball-side bond pads. In this embodiment, the conductive bulks 404 may correspond to several positions 220 of the solder ball-side bond pads. Additionally, circuit substrate 500g includes conductive bulks 406, 408 and 410. The conductive bulks 406 and 408 are disposed close to a peripheral region of the circuit substrate 500g. The conductive bulk 410 is disposed close to a corner region of the circuit substrate 500g. In this embodiment, the conductive bulks 406, 408 and 410 are fully encapsulated by the molding compound 200 to be electrically isolated from the conductive bulk 404, the other chip-side bond pads, and the other solder ball-side bond pads.

Figure 8:
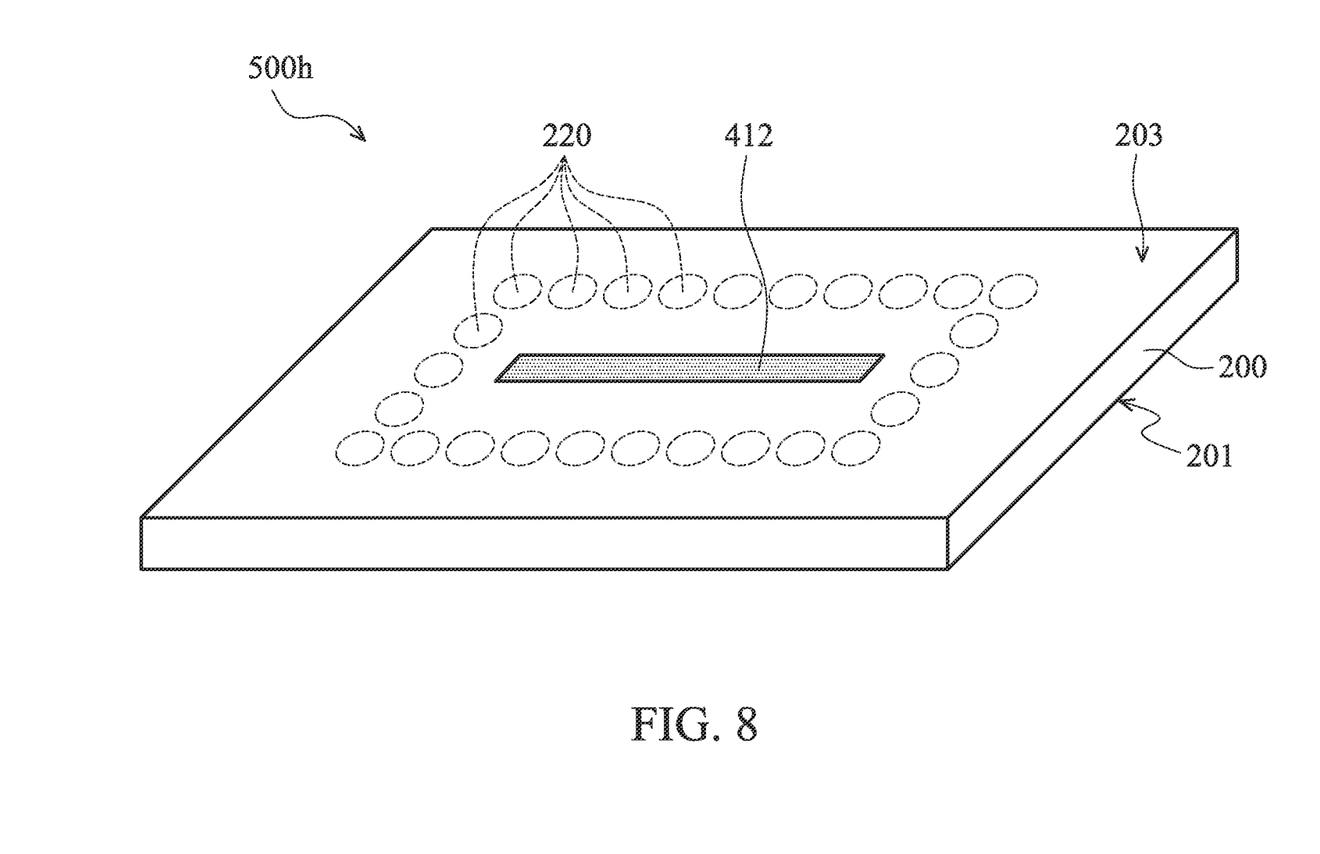

FIG. 8 is three-dimensional (3D) view of a circuit substrate 500h in accordance with one embodiment of the disclosure. For conveniently illustrating the positions of the conductive bulks, the solder mask layer is not shown herein. Actually, the conductive bulk is positioned in the molding compound and covered by the solder mask layer (or a portion of the molding compound). As shown in FIG. 8, the circuit substrate 500h may comprise a conductive bulk 412 positioned outside of the positions 220 of the solder ball-side bond pads. In this embodiment, the positions 220 of the solder ball-side bond pads are arranged to have a ring shape. Therefore, the conductive bulk 412 is surrounded by the positions 220 of the solder ball-side bond pads, because the conductive bulk 412 is fully encapsulated by the molding compound 200 and electrically isolated from the other conductive bulks, the chip-side bond pads, and the solder ball-side bond pads (not shown) in the molding compound 200. The electrically isolated conductive bulk 412 may serve as a strength-enhancement structure or a heat dissipation bulk for the circuit substrate 500h.

Figure 9:
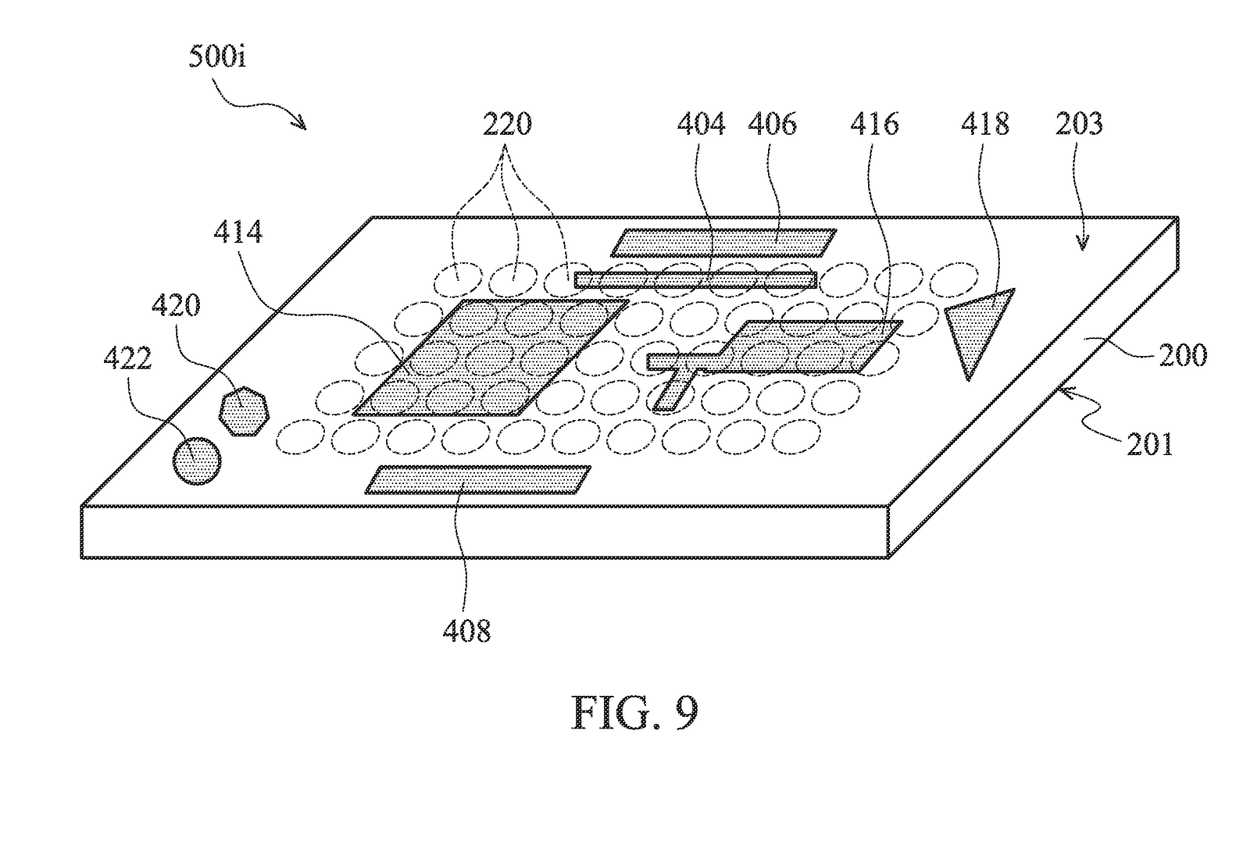

FIG. 9 is three-dimensional (3D) view of a circuit substrate 500i in accordance with one embodiment of the disclosure. For conveniently illustrating the relationship between the positions of the conductive bulk and the solder ball-side bond pad, the solder mask layer and any possible chip-side bond pads are not shown herein. Actually, the conductive bulk is positioned in the molding compound and covered by the solder mask layer (or a portion of the molding compound). As shown in FIG. 9, conductive bulks disposed in the circuit substrate 500i may have various shapes. For example, the circuit substrate 500i comprise a triangular conductive bulk 418, a square conductive bulk 414, rectangular conductive bulks 406 and 408, a polygonal conductive bulk 420, a circular conductive bulk 422 or a non-regular polygonal conductive bulk 416. The conductive bulks may be arranged in a distribution region of the positions 220 of the solder ball-side bond pads or a peripheral region of the circuit substrate 500i. When the conductive bulks 414 and 416 connect to the chip-side bond pads and the solder ball-side bond pads or the other conductive bulks, the conductive bulks 414 and 416 may serve as the interconnection structure of the circuit substrate 500i. When the conductive bulks 414 and 416 are electrically isolated the chip-side bond pads and the solder ball-side bond pads or the other conductive bulks, the conductive bulks 414 and 416 may serve as strength-enhancement structures or heat dissipation bulks for the circuit substrate 500i. For example, the conductive bulks 406, 408, 418, 420 and 422 may be disposed in a region outside of the positions 220 of the solder ball-side bond pads. Also, the conductive bulks 406, 408, 418, 420 and 422 may be electrically isolated the chip-side bond pads and the solder ball-side bond pads or the other conductive bulks to serve as strength-enhancement structures or heat dissipation bulks for the circuit substrate 500i. Alternatively, the conductive bulks 414 and 416 may disposed in the region outside of the positions 220 of the solder ball-side bond pads, and the conductive bulks 406, 408, 418, 420 and 422 may be disposed in the distribution region where the positions 220 of the solder ball-side bond pads are arranged.

Figure 10:
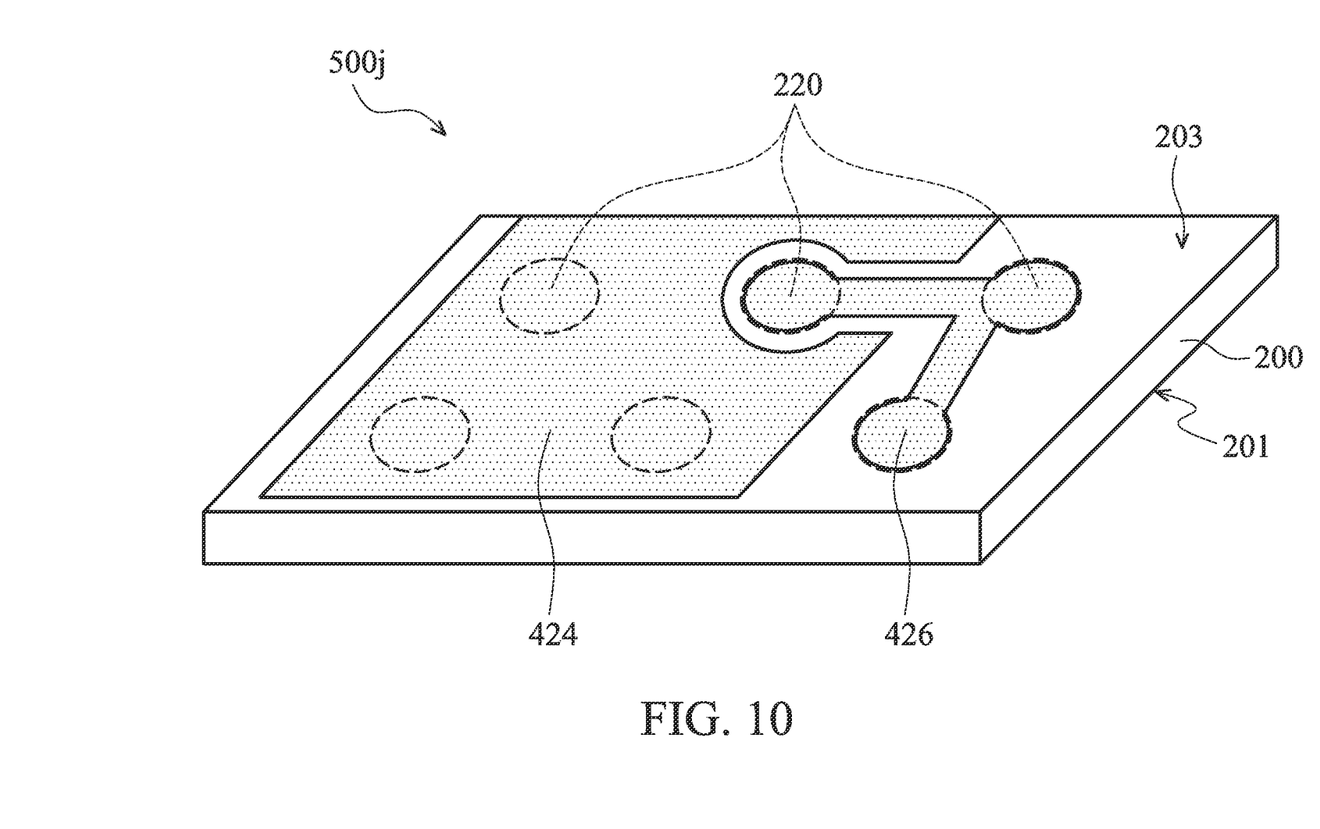

FIG. 10 is three-dimensional (3D) view of a circuit substrate 500j in accordance with one embodiment of the disclosure. For conveniently illustrating the relationship between the positions of the conductive bulk and the solder ball-side bond pad, the solder mask layer and any possible chip-side bond pads are not shown herein. Actually, the conductive bulk is positioned in the molding compound and covered by the solder mask layer (or a portion of the molding compound). As shown in FIG. 10, conductive bulks 424 and 426, which are used as the interconnection structures, may be designed as a mesh network to connect the chip-side bond pads, which are used to transmit the same type of signals (power signals, digital signals or ground (GND) signals). Also, the conductive bulks 424 and 426 can provide for bonding the corresponding pads of the chip (not shown), which are used to transmit the same type of signals. The conductive bulk 424, which occupies three of the positions 220 of the solder ball-side bond pads, and the conductive bulk 426, which occupies other three of the positions 220 of the solder ball-side bond pads, adjacent to the conductive bulk 424 may be designed as mesh networks have complementary shapes. Also, the conductive bulks 424 and 426 electrically isolated from each other. Alternatively, the conductive bulks 424 and 426 connecting several chip-side bond pads may be designed to have arbitrary shapes.

A method for fabricating the circuit substrates 500a-500j may comprise the following steps. First, a conductive substrate is provided. Next, a photolithography process and a subsequent plating process are performed to form the chip-side bond pads (e.g. the chip-side bond pads 206a, 206b, 206c1, 206c2, 206d1, 206d2, 206e1, 206f1 and 206f2 as shown in FIGS. 1B, 2B-2C, 3B-3C, 4B, 5B and 6B). Next, one or more glue-filling and molding processes are performed to form one portion of the molding compound, which serve as one of the solder mask layers, and a center portion of the molding compound (e.g. the portion 200a and the center portion of the molding compound 200 as shown in FIGS. 1B, 2B-2C, 3B-3C, 4B, 5B and 6B). Next, a photolithography process and a subsequent plating process are performed to form the conductive bulks (e.g. the conductive bulks 204a-204g as shown in FIGS. 1B, 2B-2C, 3B-3C, 4B, 5B and 6B, and the conductive bulks 404, 406, 408, 410, 412, 414, 416, 418, 420, 422, 424 and 426) and the solder ball-side bond pads (e.g. the solder ball-side bond pads 212a-212e as shown in FIGS. 1B, 2B-2C, 3B-3C, 4B, 5B and 6B). Next, one or more glue filling processes are performed to form another portion of the molding compound, which serve as another of the solder mask layers (e.g. the portion 200b as shown in FIGS. 1B, 2B-2C, 3B-3C, 4B, 5B and 6B). Also, a photolithography process may be used to form the openings in the portion 200b to expose the solder ball-side bond pads.

Embodiments provide a circuit substrate for a chip bonding thereon. The circuit substrate is formed of a molding compound and used the conductive bulk embedded in the molding compound as an interconnection structure of the circuit substrate. The size of the conductive bulk can be designed according the requirements to be coupled one or more pads of the chip, or coupled to one or more solder balls. In some embodiments, the conductive bulk may have several segments connecting to each other. The segments may respectively connect different numbers of chip-side bond pads and solder ball-side bond pads. In some other embodiments, the conductive bulk may be fully encapsulated by the molding compound to be electrically isolated from the other conductive bulks, the chip-side bond pads and the solder ball-side bond pads. The conductive bulk may provide the functions of the heat dissipation and the circuit substrate strength enhancement. Compared with the via interconnection structure of the conventional circuit substrate, the cross-sectional area of the conductive bulk is larger than that of the chip-side bond pad and that of the solder ball-side bond pads. Therefore, the conductive bulk of the circuit substrate may have improved power integrity when transmitting power signals. Additionally, the size of the conductive bulk embedded in the circuit substrate may be designed to conform to the size of the conductive lines disposed on the circuit substrate. That is to say, the cross-sectional area of the conductive bulk is substantially equal to that of the conductive lines disposed on the circuit substrate. Therefore, the conductive lines of the circuit substrate may have small impedance in the signal transmission. Also, the molding compound has a matching coefficient of thermal expansion (CTE) with the CTE of the copper conductive bulk of the circuit substrate. The substrate warpage problem is eliminated. Further, compared with the via interconnection structure of the conventional circuit substrate, which are formed by the photolithography process and the laser drilling process, the circuit substrate of the embodiments, which is formed by the plating process, may further reduce the size to improve the routing density. Additionally, the circuit substrate of the embodiments may bond to a chip to form a semiconductor package structure.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit substrate for a chip bonding thereon, comprising:
    a molding compound having a chip-side surface and a solder ball-side surface opposite from the chip-side surface; and
    a first conductive bulk formed embedded in the molding compound, wherein the first conductive bulk is columnar from top to bottom, and the first conductive bulk has a first number of first chip-side bond pad surfaces exposed from the chip-side surface and a second number of first ball-side bond pad surfaces exposed from the solder ball-side bond pad surface, wherein a width of the first conductive bulk is greater than a first width of the first chip-side bond pad surfaces and a second width of the first ball-side bond pad surfaces in a cross-sectional view, and in a top view, a projection of the first ball-side bond pad surfaces totally falls within a range of a projection of the first conductive bulk.

2. The circuit substrate as claimed in claim 1, wherein the first number is equal to the second number, the first number is a positive number and the second number is a positive number.

3. The circuit substrate as claimed in claim 1, wherein the first conductive bulk comprises:
    a first segment; and
    a second segment connecting to the first segment through a first connecting portion, wherein the first ball-side bond pad surface is positioned at least one of the first segment and the second segment.

4. The circuit substrate as claimed in claim 3, wherein the first segment and the second segment each have at least one of the first chip-side bond pad surfaces.

5. The circuit substrate as claimed in claim 3, wherein the first number is not less than the second number, the first number is a positive number and the second number is a positive number.

6. The circuit substrate as claimed in claim 3, wherein a surface of the first connecting portion connects to sidewalls of the first segment and the second segment.

7. The circuit substrate as claimed in claim 1, further comprising:
    a second conductive bulk formed embedded in the molding compound, wherein the second conductive bulk having a single second chip-side bond pad surface exposed from the chip-side surface and a single second ball-side bond pad surface exposed from the solder ball-side bond pad surface.

8. The circuit substrate as claimed in claim 7, wherein a first area of the first conductive bulk is different from a second area of the second conductive bulk in a bottom view.

9. The circuit substrate as claimed in claim 7, further comprising:
    a third conductive bulk fully encapsulated by the molding compound, wherein the third conductive bulk is isolated from the first conductive bulk and the second conductive bulk.

10. The circuit substrate as claimed in claim 1, further comprising:
    a third conductive bulk fully surrounded by the molding compound, wherein the third conductive bulk is isolated from the first conductive bulk.

11. The circuit substrate as claimed in claim 10, wherein the third conductive bulk comprises:
    a third segment; and
    a fourth segment connecting to the third segment through a second connecting portion, wherein a surface of the second connecting portion connects to sidewalls of the third segment and the fourth segment.

12. A package structure, comprising:
    a circuit substrate, wherein the circuit substrate comprises:
    a molding compound having a chip-side surface and a solder ball-side bond pad surface opposite from the chip-side surface; and
    a first conductive bulk formed embedded in the molding compound, wherein the first conductive bulk is columnar from top to bottom, and the first conductive bulk has a first number of first chip-side bond pad surfaces exposed from the chip-side surface and a second number of first ball-side bond pad surfaces exposed from the solder ball-side bond pad surface, wherein a width of the first conductive bulk is greater than a first width of the first chip-side bond pad surfaces and a second width of the first ball-side bond pad surfaces in a cross-sectional view, and in a top view, a projection of the first ball-side bond pad surfaces totally falls within a range of a projection of the first conductive bulk; and
    a chip bonding the circuit substrate, wherein the chip comprises:
    a plurality of pads connecting the first chip-side bond pad surfaces through a plurality of pads, respectively.

13. The package structure as claimed in claim 12, wherein the first number is equal to the second number, the first number is a positive number and the second number is a positive number.

14. The package structure as claimed in claim 12, wherein the first conductive bulk comprises:
    a first segment; and
    a second segment connecting to the first segment through a first connecting portion, wherein the first ball-side bond pad surface is positioned at least one of the first segment and the second segment.

15. The package structure as claimed in claim 14, wherein the first segment and the second segment each have at least one of the first chip-side bond pad surfaces.

16. The package structure as claimed in claim 14, wherein the first number is not less than the second number, the first number is a positive number and the second number is a positive number.

17. The package structure as claimed in claim 14, wherein a surface of the first connecting portion connects to sidewalls of the first segment and the second segment.

18. The package structure as claimed in claim 12, further comprising:

a second conductive bulk formed embedded in the molding compound, wherein the second conductive bulk having a single second chip-side bond pad surface exposed from the chip-side surface and a single second ball-side bond pad surface exposed from the solder ball-side bond pad surface.

19. The package structure as claimed in claim 18, wherein a first area of the first conductive bulk is different from a second area of the second conductive bulk in a bottom view.

20. The package structure as claimed in claim 18, further comprising:
a third conductive bulk fully encapsulated by the molding compound, wherein the third conductive bulk is isolated from the first conductive bulk and the second conductive bulk.

21. The package structure as claimed in claim 12, further comprising:
a third conductive bulk fully encapsulated by the molding compound, wherein the third conductive bulk is isolated from the first conductive bulk.

22. The package structure as claimed in claim 21, wherein the third conductive bulk comprises:
a third segment; and
a fourth segment connecting to the third segment through a second connecting portion, wherein a surface of the second connecting portion connects to sidewalls of the third segment and the fourth segment.

23. A circuit substrate for a chip bonding thereon, comprising:
a molding compound having a chip-side surface and a solder ball-side surface opposite from the chip-side surface; and
a first conductive bulk formed embedded in the molding compound, wherein the first conductive bulk is columnar from top to bottom, and the first conductive bulk has a first number of first chip-side bond pad surfaces exposed from the chip-side surface and a second number of first ball-side bond pad surfaces exposed from the solder ball-side bond pad surface, wherein a width of the first conductive bulk is greater than a first width of the first chip-side bond pad surfaces and a second width of the first ball-side bond pad surfaces in a cross-sectional view, and in a top view, a projection of the first ball-side bond pad surfaces totally falls within a range of a projection of the first conductive bulk, wherein all of the first chip-side bond pad surfaces are non-coplanar with the chip-side surface and the solder ball-side surface.

24. The circuit substrate as claimed in claim 23, wherein the first number is different from the second number, the first number is a positive number and the second number is a positive number.

25. The circuit substrate as claimed in claim 23, wherein the first number is equal to the second number, the first number is a positive number and the second number is a positive number.

26. The circuit substrate as claimed in claim 23, wherein the first conductive bulk comprises:
a first segment; and
a second segment connecting to the first segment through a first connecting portion, wherein the first ball-side bond pad surface is positioned at least one of the first segment and the second segment.

27. The circuit substrate as claimed in claim 23, further comprising:
a second conductive bulk formed embedded in the molding compound, wherein the second conductive bulk having a single second chip-side bond pad surface exposed from the chip-side surface and a single second ball-side bond pad surface exposed from the solder ball-side bond pad surface.

28. The circuit substrate as claimed in claim 23, further comprising:
a third conductive bulk fully surrounded by the molding compound, wherein the third conductive bulk is isolated from the first conductive bulk.

29. The circuit substrate as claimed in claim 1, wherein the first number is different from the second number, the first number is a positive number and the second number is a positive number.

30. The package structure as claimed in claim 12, wherein the first number is not equal to the second number, the first number is a positive number and the second number is a positive number.

* * * * *